(12) United States Patent
Yasuda

(10) Patent No.: US 6,414,855 B1
(45) Date of Patent: Jul. 2, 2002

(54) POWER CONVERTER WITH POWER CONVERTER ELEMENT AND CONTROLLER FORMED ON DIFFERENT SEMICONDUCTOR SUBSTRATES

(75) Inventor: Yukio Yasuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/840,172

(22) Filed: Apr. 24, 2001

(30) Foreign Application Priority Data

Nov. 20, 2000 (JP) ......................... 2000-352604

(51) Int. Cl.[7] ............................................. H02M 3/335
(52) U.S. Cl. ........................... 363/19; 323/349; 323/901
(58) Field of Search ................................ 323/349, 907, 323/351; 363/19

(56) References Cited

U.S. PATENT DOCUMENTS 5,237,262 A * 8/1993 Ashley et al. .............. 323/284
5,498,958 A * 3/1996 Tu et al. ................. 324/207.16
5,793,241 A * 8/1998 Sanzo et al. ................. 327/323
6,229,350 B1 * 5/2001 Ricon-Mora ................. 327/77

\* cited by examiner

Primary Examiner—Bao Q. Vu
(74) Attorney, Agent, or Firm—Oblon, Spivak, McClelland, Maier & Neustadt, P.C.

(57) ABSTRACT

A power converter individually comprises a first semiconductor device <2> and a second semiconductor device <3>. In the first semiconductor device <2>, a power conversion element such as an IGBT <19>, Zener diodes <20, 21>, a waveform shaping circuit <30>, a heating cutoff circuit <31> and a protective element <14> are formed on the same chip employing a p-type silicon substrate. In the second semiconductor device <3>, a Schmidt circuit <9>, a power supply circuit <10>, a high voltage detection circuit <11>, a protective element <13>, a logic gate <16> and an output circuit formed by a pnp transistor <17> are formed on the same chip employing a p-type silicon substrate. Thus, a power converter capable of reducing the circuit scale as a whole is obtained.

15 Claims, 8 Drawing Sheets

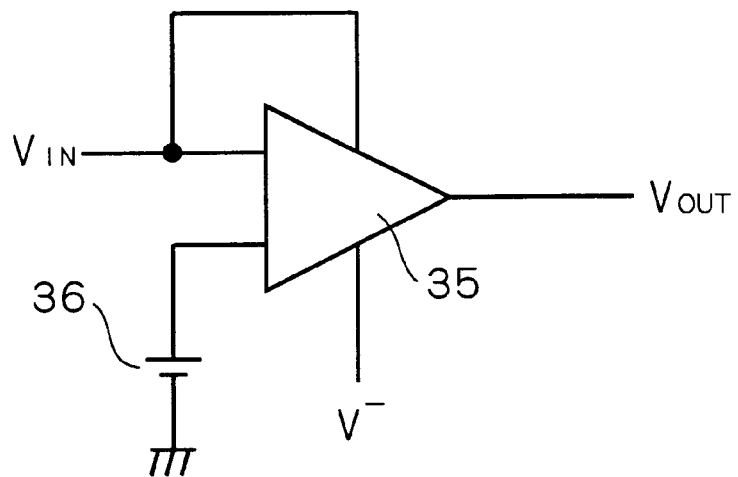
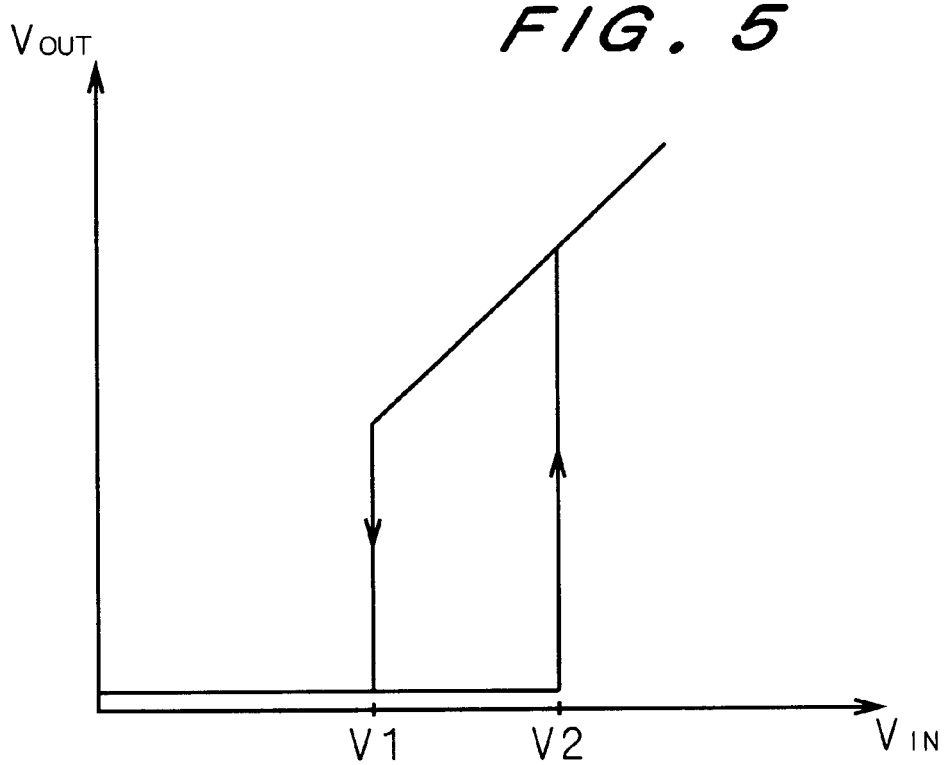

POWER CONVERTER WITH POWER CONVERTER ELEMENT AND CONTROLLER FORMED ON DIFFERENT SEMICONDUCTOR SUBSTRATES

BACKGROUND OF THE INVENTION

1. Field of the Invention

The present invention relates to the structure of a power converter comprising a power conversion element and the structure of a semiconductor device employed for this power converter.

2. Description of the Background Art

FIG. 13 is a circuit diagram showing the structure of a conventional power converter 101. Referring to FIG. 13, the conventional power converter 101 is applied to a drive unit for an ignition coil 105. The ignition coil 105 controls an ignition plug 104 employed for the engine of an automobile. The power converter 101 individually comprises a semiconductor device 102 and another semiconductor device 103. In the semiconductor device 102, a power conversion element such as an IGBT (insulated gate bipolar transistor) 119 and Zener diodes 120 and 121 are formed on the same chip employing a silicon substrate. The IGBT 119 may be replaced with another element such as a power MOSFET or a bipolar power transistor. What kind of element is employed as the power conversion element is not important for the present invention but any one of existing elements and currently studied elements may be employed. The following description is made with reference to the IGBT employed as the power conversion element.

The Zener diodes 120 and 121 are elements specific to the drive unit for driving the ignition coil. The IGBT 119 is formed as an aggregate of small elements referred to as cells, and emitter wires for these cells are divided into two systems for intentionally causing difference between the numbers of the cells connected to the respective emitter wires. The magnitude of a current flowing in an emitter depends on the ratio of cell numbers, and hence a collector current (main current flowing in the power conversion element) of the IGBT 119 can be indirectly measured by detecting a small current having unique correlation with the current flowing in the power conversion element.

In the semiconductor 103, a difference voltage comparison circuit 109, a power supply circuit 110, a high voltage detection circuit 111, protective elements 113 and 114, a timer circuit 115, a logic gate 116, an output circuit formed by an npn transistor 117 and a negative feedback control circuit 118 are formed on the same chip employing a silicon substrate.

The difference voltage comparison circuit 109 has two input terminal, and the first input terminal is connected to a terminal 107 (control input terminal from a control unit (not shown)) of the power converter 101 through a circuit formed by a resistance and a capacitor. The second input terminal is connected to another terminal 108 (reference potential input terminal from the aforementioned control unit (not shown)) of the power converter 101 through the aforementioned circuit. The difference voltage comparison circuit 109 has a waveform shaping function exhibiting a hysteretic characteristic, in order to prevent a malfunction resulting from fluctuation of the potential of the silicon substrate employed for the semiconductor device 103. The difference voltage comparison circuit 109 is formed by a Schmidt circuit exhibiting a hysteretic characteristic and other elements.

The timer circuit 115 is provided for preventing the IGBT 119 from breakage resulting from heat generated when the IGBT 119 is continuously energized over a long period. When the IGBT 119 is continuously energized in excess of a prescribed time (several 100 ms) and the voltage of a capacitor (proportionate to the energization time for the IGBT 119) input in a positive phase input terminal of a comparator exceeds a prescribed constant voltage input in a negative phase input terminal, the timer circuit 115 regards that the quantity of heat generated from the IGBT 119 is increased and inputs a signal for stopping drive of the npn transistor 117 in the logic gate 116.

The power supply circuit 110 supplies power for driving various circuits provided in the semiconductor device 103. The battery voltage (the voltage of a battery 106) of the automobile fluctuates in a wide range (about several V to 24 V), and hence the power supply circuit 110 generating a constant power supply voltage regardless of the voltage of the battery 106 is provided in order to stably operate the timer circuit 115, a waveform shaping circuit provided in the difference voltage comparison circuit 109 and the like.

The high voltage detection circuit 111 has a function of forcibly stopping drive of the IGBT 119 when the voltage of the battery 106 is abnormally increased, in order to prevent breakage. The high voltage detection circuit 111 detects that the voltage of the battery 106 exceeds a prescribed voltage (about 30 V) and inputs a signal for stopping drive of the npn transistor 117 in the logic gate 116.

The negative feedback control circuit 118 has a function of detecting the value of the emitter current of the IGBT 119 and controlling operations of the IGBT 119 so that the main current does not flow in excess of a prescribed value. When the voltage input in the negative phase input terminal (voltage of a resistor connected to the emitter of the IGBT 119, proportionate to the emitter current) exceeds the prescribed constant voltage input in the positive phase input terminal, the negative feedback control circuit 118 inputs a signal for stopping drive of the IGBT 119 in a gate electrode of the IGBT 119.

The protective elements 113 and 114 have a function of suppressing a voltage applied to the circuit not to exceed a prescribed level, thereby protecting the circuit.

When the semiconductor device 103 drives the IGBT 119 by its control operation, a current flows toward a primary winding of the ignition coil 105 (toward the power converter 101), and a resulting primary winding voltage is multiplied by the turn ratio and transmitted toward a secondary winding of the ignition coil 105 (toward the ignition plug 104). Sparks come off between gaps of the ignition plug 104 due to this voltage to combust fuel in a cylinder (not shown) and provide motive power for the engine.

When stopping drive of the IGBT 119 and cutting off the current flowing toward the primary winding of the ignition coil 105, energy stored in the ignition coil 105 generates force (counter electromotive force) stepping up a collector voltage of the IGBT 119 to the positive direction. When a voltage exceeding a reverse withstand voltage of the Zener diode 120 is caused, the Zener diode 120 operates to increase a gate voltage of the IGBT 119 and drive the OFF-state IGBT 119 as a result. Thus, the collector voltage is kept in a constant state.

In the conventional power converter 101 shown in FIG. 13, however, a number of circuits such as the difference voltage comparison circuit 109, the timer circuit 115, the negative feedback control circuit 118 and the like are formed in the semiconductor device 103 to disadvantageously increase the circuit scale of the semiconductor device 103 in particular.

SUMMARY OF THE INVENTION

According to a first aspect of the present invention, a power converter comprises: a first semiconductor device including a first semiconductor substrate and a power conversion element formed on the first semiconductor substrate; and a second semiconductor device formed on a second semiconductor substrate different from the first semiconductor substrate for generating a control signal for controlling drive of the power conversion element and inputting the control signal in the first semiconductor device on the basis of a signal input from an external control unit.

According to a second aspect of the present invention, in the first aspect, the first semiconductor device further includes a cutoff circuit formed on the first semiconductor substrate for detecting the temperature of the first semiconductor substrate on a portion formed with the power conversion element and stopping drive of the power conversion element when the temperature exceeds a prescribed level.

According to the second aspect, the cutoff circuit directly detects heat generated from the power conversion element and stops drive of the power conversion element on the basis of the result of detection. As compared with a power converter employing a timer circuit stopping drive of a power conversion element in response to a continuous energization time for the power conversion element, therefore, the power conversion element can be more effectively prevented from a failure resulting from heat generation.

Further, the cutoff circuit can be formed more simply than the timer circuit, whereby the structure of the overall power converter can also be simplified.

According to a third aspect of the present invention, in the first aspect, the first semiconductor device further includes a waveform shaping circuit exhibiting a hysteretic characteristic, formed on the first semiconductor substrate, and the waveform shaping circuit operates with drive power of a potential input in its own input terminal.

According to the third aspect, the waveform shaping circuit may be provided with no power supply terminal for externally supplying drive power, whereby the circuit structure can be simplified as compared with a waveform shaping circuit driven by externally supplied power.

According to a fourth aspect of the present invention, in the first to third aspects, the second semiconductor device has an output circuit for outputting the control signal, formed on the second semiconductor substrate, and the output circuit is formed by a pnp transistor or a p-channel MOSFET formed in an n-type semiconductor layer.

According to the fourth aspect, the pnp transistor or the p-channel MOSFET can be inhibited from an erroneous operation also when the potential of the second semiconductor substrate is transitionally increased while the pnp transistor or the p-channel MOSFET is in an OFF state.

According to a fifth aspect of the present invention, in the first to fourth aspects, the first semiconductor device and the second semiconductor device individually include GND terminals supplied with GND levels.

According to the fifth aspect, a malfunction following fluctuation of the potential of the second semiconductor substrate resulting from a main current of the power conversion element can be suppressed by forming a Schmidt circuit simply comparing a voltage input in a positive phase input terminal and a constant voltage input in a negative phase input terminal with each other on the second semiconductor substrate.

According to a sixth aspect of the present invention, in the fifth aspect, the power converter further comprises a voltage limiting circuit limiting a potential difference between the GND level of the first semiconductor device and the GND level of the second semiconductor device within a prescribed value.

According to the sixth aspect, a malfunction resulting from abnormally large potential difference between the GND level of the first semiconductor device and the GND level of the second semiconductor device can be suppressed so that the power converter causes a smaller number of malfunctions.

According to a seventh aspect of the present invention, in the sixth aspect, the voltage limiting circuit is formed on the second semiconductor substrate.

According to the seventh aspect, the number of components can be reduced as compared with the case of forming the voltage limiting circuit as a component independent of the second semiconductor device.

According to an eighth aspect of the present invention, a power converter comprises a first semiconductor device having a power conversion element formed on a first semiconductor substrate and a second semiconductor device formed on a second semiconductor substrate different from the first semiconductor substrate for generating a control signal for controlling drive of the power conversion element and inputting the control signal in the first semiconductor device on the basis of a signal input from an external control unit, while the first semiconductor device and the second semiconductor device individually include GND terminals supplied with GND levels.

According to the eighth aspect, a malfunction following fluctuation of the potential of the second semiconductor substrate resulting from a main current of the power conversion element can be suppressed by forming a Schmidt circuit simply comparing a voltage input in a positive phase input terminal and a constant voltage input in a negative phase input terminal with each other on the second semiconductor substrate.

According to a ninth aspect of the present invention, in the eighth aspect, the power converter further comprises a voltage limiting circuit limiting a potential difference between the GND level of the first semiconductor device and the GND level of the second semiconductor device within a prescribed value.

According to the ninth aspect, a malfunction resulting from abnormally large potential difference between the GND level of the first semiconductor device and the GND level of the second semiconductor device can be suppressed so that the power converter causes a smaller number of malfunctions.

According to a tenth aspect of the present invention, in the ninth aspect, the voltage limiting circuit is formed on the second semiconductor substrate.

According to the tenth aspect, the number of components can be reduced as compared with the case of forming the voltage limiting circuit as a component independent of the second semiconductor device.

According to an eleventh aspect of the present invention, a semiconductor device comprises a semiconductor substrate, a power conversion element formed on the semiconductor substrate and a cutoff circuit formed on the semiconductor substrate for detecting the temperature of the semiconductor substrate on a portion formed with the power conversion element and stopping drive of the power conversion element when the temperature exceeds a prescribed level.

According to the eleventh aspect, the cutoff circuit directly detects heat generated from the power conversion element and stops drive of the power conversion element on the basis of the result of detection. Therefore, the power conversion element can be more effectively prevented from a failure resulting from heat generation.

According to a twelfth aspect of the present invention, in the eleventh aspect, the semiconductor device further comprises a waveform shaping circuit exhibiting a hysteretic characteristic, formed on the semiconductor substrate, while the waveform shaping circuit operates with drive power of a potential input in its own input terminal.

According to the twelfth aspect, the waveform shaping circuit may be provided with no power supply terminal for externally supplying drive power, whereby the circuit structure can be simplified as compared with a waveform shaping circuit driven by externally supplied power.

According to a thirteenth aspect of the present invention, a semiconductor device comprises a semiconductor substrate of a first conductivity type, a semiconductor layer of a second conductivity type, different from the first conductivity type, formed on the semiconductor substrate, a first Zener diode having a first electrode defined by a first impurity-introduced region of the first conductivity type formed in the semiconductor layer and a second electrode defined by a second impurity-introduced region of the second conductivity type formed in the semiconductor layer, a second Zener diode having a first electrode defined by a third impurity-introduced region of the first conductivity type formed in the semiconductor layer and a second electrode defined by a fourth impurity-introduced region of the second conductivity type formed in the semiconductor layer and connected to the second electrode of the first Zener diode, and a wire formed on a main surface of the semiconductor layer for fixing the potential of the semiconductor layer.

According to the thirteenth aspect, it is possible to avoid drive of a parasitic transistor having an emitter defined by the semiconductor substrate, a base defined by the semiconductor layer and a collector defined by the third impurity-introduced region by fixing the potential of the semiconductor layer to a level exceeding the reverse voltage of the first Zener diode by the wire.

An object of the present invention is to obtain a power converter capable of reducing the circuit scale as a whole and a semiconductor device employed for this power converter.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit diagram showing a second structure of the waveform shaping circuit shown in FIG. 1;

FIG. 5 is a graph showing input/output characteristics of a Schmidt circuit shown in FIG. 4;

DESCRIPTION OF THE PREFERRED EMBODIMENTS

Embodiment 1

Figure 1:
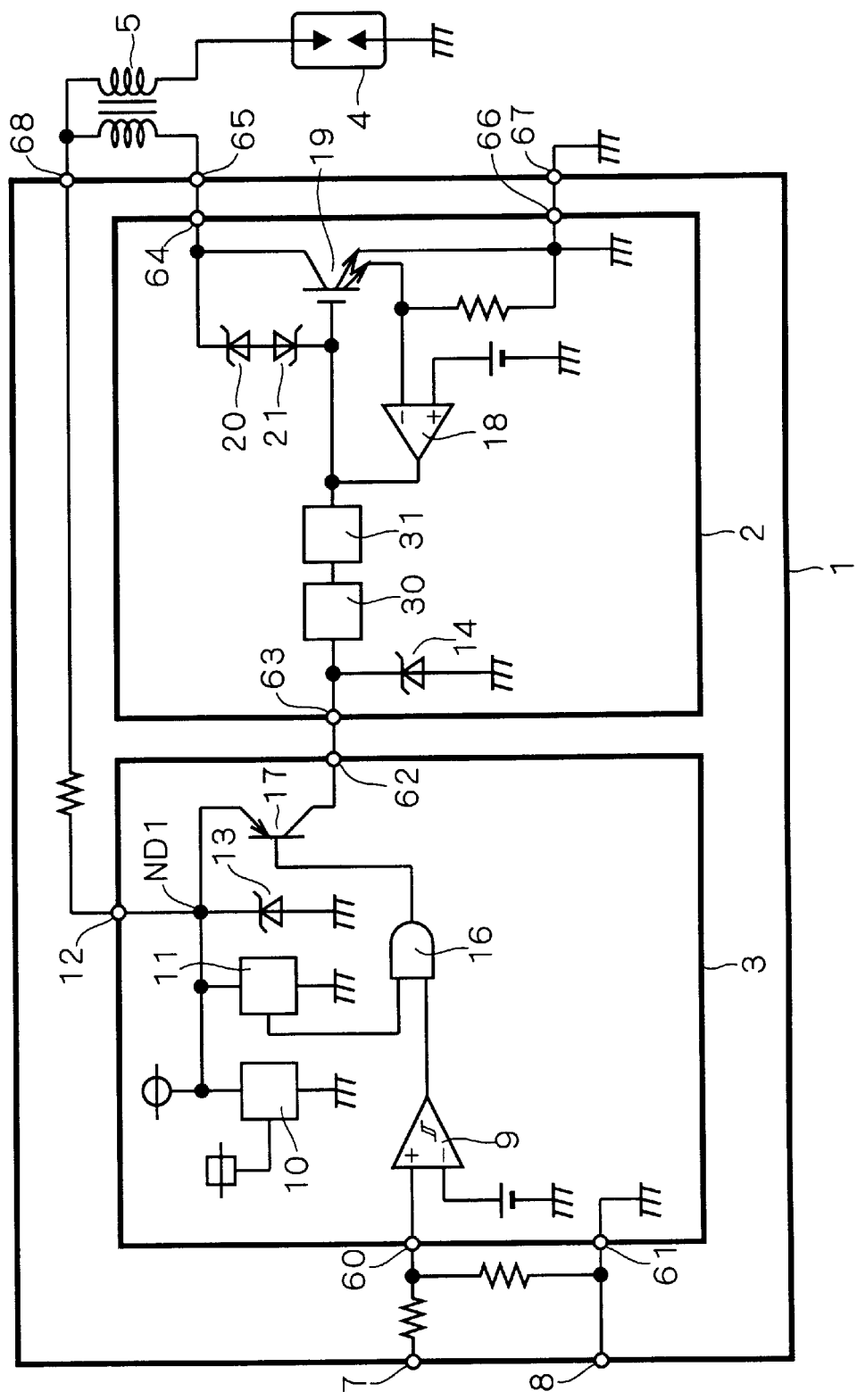
FIG. 1 is a circuit diagram showing a structure of a power converter according to an embodiment 1 of the present invention.

FIG. 1 is a circuit diagram showing the structure of a power converter 1 according to an embodiment 1 of the present invention. Referring to FIG. 1, the power converter 1 according to the embodiment 1 is applied to a drive unit for an ignition coil 5. The ignition coil 5 controls an ignition plug 4 employed for the engine of an automobile. The power converter 1 individually comprises a semiconductor device 2 and another semiconductor device 3. In the semiconductor device 2, a power conversion element such as an IGBT 19, Zener diodes 20 and 21, a waveform shaping circuit 30, a heating cutoff circuit 31 and a protective element 14 are formed on the same chip employing a p-type silicon substrate. The semiconductor device 2 has a GND terminal 66 supplied with a GND level.

The Zener diodes 20 and 21 are elements specific to the drive unit for driving the ignition coil. The IGBT 19 is formed as an aggregate of small elements referred to as cells, and emitter wires for these cells are divided into two systems for intentionally causing difference between the numbers of the cells connected to the respective emitter wires. The magnitude of a current flowing in an emitter depends on the ratio of cell numbers, and hence a collector current (main current flowing in the power conversion element) of the IGBT 19 can be indirectly measured by detecting a small current having unique correlation with the current flowing in the power conversion element.

The heating cutoff circuit 31 has a function of detecting the temperature of the p-type silicon substrate in the portion formed with the IGBT 19 and limiting a signal output from the waveform shaping circuit 30 not to be transmitted to the IGBT 19 (i.e., stopping drive of the IGBT 19) when the temperature of this portion exceeds a prescribed level. The heating cutoff circuit 31 detects the temperature of the p-type silicon substrate in the portion formed with the IGBT 19 with a temperature-voltage conversion element such as a diode or a transistor formed in the vicinity of the IGBT 19 and compares a voltage from the temperature-voltage conversion element with a prescribed constant voltage by a comparator. When the voltage from the temperature-voltage conversion element exceeds the prescribed constant voltage, the heating cutoff circuit 31 stops drive of the IGBT 19.

The negative feedback control circuit 18 has a function of detecting the value of an emitter current of the IGBT 19 and controlling operations of the IGBT 19 so that a main current does not flow in excess of a prescribed value. When a voltage input in a negative phase input terminal (voltage of a resistor connected to an emitter of the IGBT 19, proportionate to the emitter current) exceeds a prescribed constant voltage input in a positive phase input terminal, the negative feedback control circuit 18 inputs a signal for stopping drive of the IGBT 19 in a gate electrode of the IGBT 19.

The protective element 14 has a function of inhibiting a voltage applied to the circuit from exceeding a prescribed voltage thereby protecting the circuit.

Figure 2:
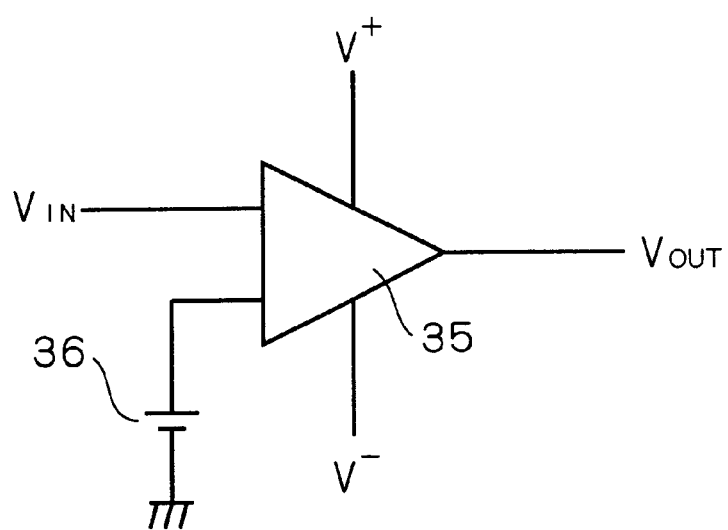
FIG. 2 is a circuit diagram showing a first structure of a waveform shaping circuit shown in FIG. 1.

The waveform shaping circuit 30 is provided for suppressing a malfunction following such a phenomenon that the potential of the p-type silicon substrate employed for the semiconductor device 2 is apparently increased due to the main current flowing in the IGBT 19 to apparently reduce the threshold of the IGBT 19. FIG. 2 is a circuit diagram showing a first structure of the waveform shaping circuit 30. The waveform shaping circuit 30 shown in FIG. 2 is formed by a Schmidt circuit 35 having a first input terminal receiving a potential $V_{IN}$ from a terminal 63 of the semiconductor device 2, a second input terminal receiving a prescribed constant voltage from a power source 36 and an output terminal outputting a potential $V_{OUT}$ to the heating cutoff circuit 31. The Schmidt circuit 35 shown in FIG. 2 is driven by externally supplied power $V^+$.

Figure 3:
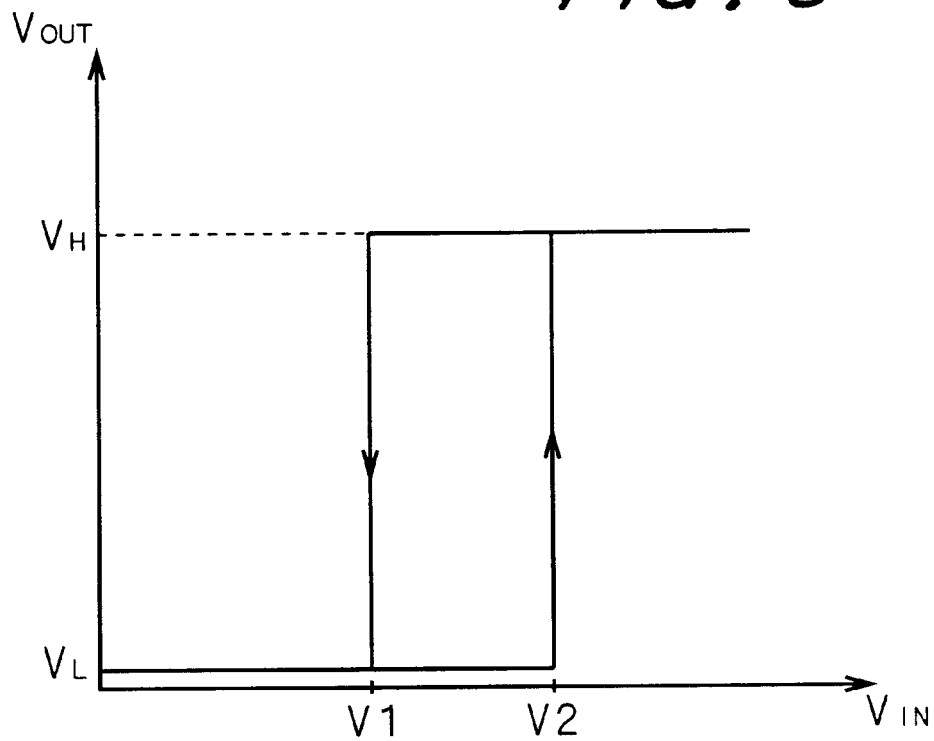
FIG. 3 is a graph showing input/output characteristics of a Schmidt circuit shown in FIG. 1.

FIG. 3 is a graph showing the input/output characteristics of the Schmidt circuit 35 shown in FIG. 2. As shown in FIG. 3, the Schmidt circuit 35 exhibits a hysteretic characteristic. When a voltage exceeding a voltage value V2 is applied to the first input terminal while the potential $V_{OUT}$ of the output terminal is $V_L$, the potential $V_{OUT}$ of the output terminal reaches $V_H (>V_L)$. When the potential $V_{OUT}$ of the output terminal is $V_H$, on the other hand, the potential $V_{OUT}$ of the output terminal does not reach $V_L$ unless a voltage below the voltage value V1(<V2) is input in the first input terminal. Thus, the aforementioned malfunction following apparent reduction of the threshold of the IGBT 19 is suppressed by a hysteresis voltage expressed as V2−V1.

FIG. 4 is a circuit diagram showing a second structure of the waveform shaping circuit 30. The waveform shaping circuit 30 shown in FIG. 4 is formed by a Schmidt circuit 35 having a first input terminal receiving a potential $V_{IN}$ from the terminal 63, a second input terminal receiving a prescribed constant voltage from a power source 36 and an output terminal outputting a potential $V_{OUT}$ to the heating cutoff circuit 31 similarly to the Schmidt circuit 35 shown in FIG. 2. Dissimilarly to the Schmidt circuit 35 shown in FIG. 2, the Schmidt circuit 35 shown in FIG. 4 operates with drive power of not externally supplied power $V^+$ but the potential $V_{IN}$ input in the first input terminal.

FIG. 5 is a graph showing the input/output characteristics of the Schmidt circuit 35 shown in FIG. 4. As shown in FIG. 5, the Schmidt circuit 35 shown in FIG. 4 waveform-shapes the level of its power supply voltage with a hysteretic characteristic. More specifically, the Schmidt circuit 35 cuts off (high impedance) a supplied input signal with respect to an input less than a prescribed value (V2 in a voltage rise process and V1 in a voltage drop process) and transmits a supplied input signal as such with respect to an input exceeding the aforementioned prescribed value. According to the Schmidt circuit 35 shown in FIG. 4, no power supply terminal may be provided for supplying drive power, whereby the circuit structure can be simplified as compared with the Schmidt circuit 35 shown in FIG. 2.

Referring to FIG. 1, the semiconductor device 3 generates a control signal for controlling the IGBT 19 on the basis of a signal input in a terminal 60 from an external control unit (not shown) connected to a terminal 7 of the power converter 1 and inputs the control signal in the terminal 63 of the semiconductor device 2 through a terminal 62. In the semiconductor device 3, a Schmidt circuit 9, a power supply circuit 10, a high voltage detection circuit 11, a protective element 13, a logic gate 16 and an output circuit formed by a pnp transistor 17 are formed on the same chip employing a p-type silicon substrate. The semiconductor device 3 has a GND terminal 61 supplied with a GND level.

Figure 6:
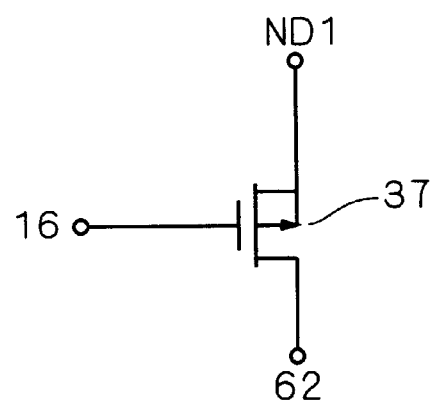
FIG. 6 is a circuit diagram showing another exemplary structure of an output circuit.

The pnp transistor 17 has an emitter electrode connected to a node ND1, a base electrode connected to an output terminal of the logic gate 16 and a collector electrode connected to the terminal 62 of the semiconductor device 3 respectively. Alternatively, an output circuit may be formed by a p-channel MOSFET in place of the output circuit consisting of the pnp transistor 17. FIG. 6 is a circuit diagram showing another exemplary output circuit. A p-channel MOSFET 37 has a source electrode connected to the node ND 1, a gate electrode connected to the output terminal of the logic gate 16 and a drain electrode connected to the terminal 62 of the semiconductor device 3 respectively.

Referring again to FIG. 1, the Schmidt circuit 9 is provided for preventing a malfunction resulting from fluctuation of the potential of the p-type silicon substrate employed for the semiconductor device 3, and has a waveform shaping function exhibiting a hysteretic characteristic. The Schmidt circuit 9 has two input terminals including a positive phase input terminal and a negative phase input terminal, and the positive phase input terminal is connected to the terminal 7 (control input terminal from the unillustrated control unit) of the power converter 1 through a terminal 60 of the semiconductor device 3 and a prescribed circuit consisting of a resistor. The negative phase input terminal receives a prescribed reference potential from a power source.

Figure 13:
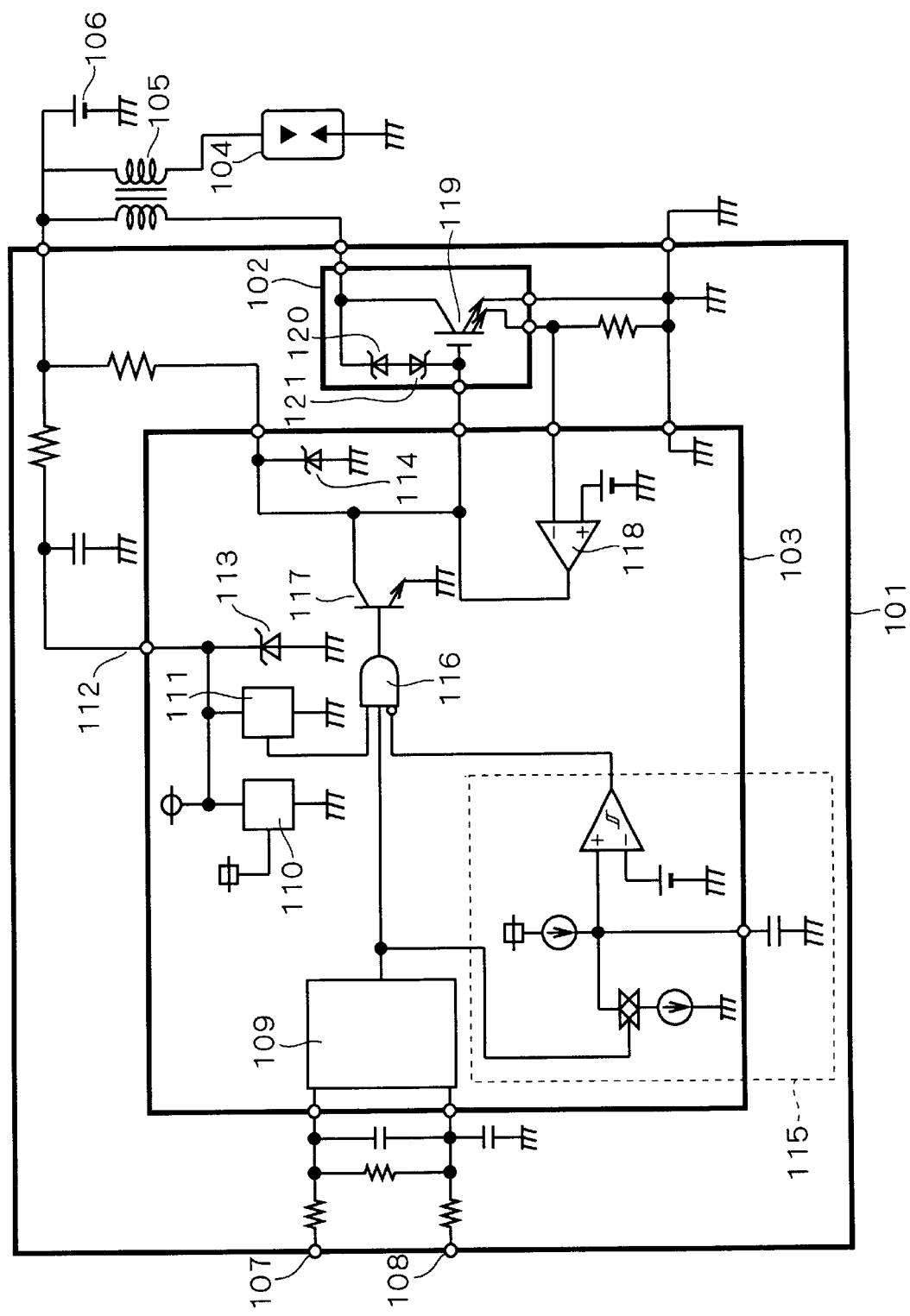
FIG. 13 is a circuit diagram showing a structure of a conventional power converter.

The power supply circuit 10, supplying power for driving various circuits provided in the semiconductor device 3, corresponds to the power supply circuit 110 in the conventional power converter 101 shown in FIG. 13. The high voltage detection circuit 11, having a function of forcibly stopping drive of the IGBT 19 for preventing breakage when the voltage of an external battery abnormally increases, corresponds to the high voltage detection circuit 111 in the conventional power converter 101 shown in FIG. 13.

The protective element 13, having a function of protecting a circuit by inhibiting a voltage applied to the circuit from exceeding a prescribed level, corresponds to the protective element 113 in the conventional power converter 101 shown in FIG. 13.

When the IGBT 19 is driven, a current flows toward a primary winding of the ignition coil 5 (toward the power converter 1) and a resulting primary winding voltage is multiplied by the turn ratio and transmitted toward a secondary winding of the ignition coil 5 (toward the ignition plug 4). Sparks come off between gaps of the ignition plug 4 due to this voltage to combust fuel in a cylinder (not shown) and provide motive power for the engine.

When drive of the IGBT 19 is stopped to cut off the current flowing toward the primary winding of the ignition coil 5, energy stored in the ignition coil 5 generates force (counter electromotive force) stepping up a collector voltage of the IGBT 19 to the positive direction. When a voltage exceeding a reverse withstand voltage of the Zener diode 20 is caused, the Zener diode 20 operates to increase a gate voltage of the IGBT 19 and drive the OFF-state IGBT 19 as a result. Thus, the collector voltage is kept in a constant state.

In the power converter 1 according to the embodiment 1, as hereinabove described, the timer circuit 115 is eliminated from the conventional semiconductor device 103 shown in FIG. 13 and the heating cutoff circuit 31 having a simpler structure than the timer circuit 115 is formed in the semiconductor device 2 provided with the IGBT 19. Therefore, the structure of the overall power converter 1 can be simplified. The heating cutoff circuit 31 directly detects the quantity of heat generated from the IGBT 19 and stops drive of the IGBT 19 on the basis of the result of detection. As compared with the conventional timer circuit 115 stopping drive of the IGBT 119 in response to the continuous energization time for the IGBT 119, therefore, the IGBT 19 can be more effectively prevented from a failure resulting from heat generation.

As shown in FIG. 1, the potential of the GND terminal 61 supplying the GND level of the semiconductor device 3 is equal to the potential of a terminal 8 of the power converter 1 receiving the reference potential from the control unit (not shown). In place of the difference voltage comparison circuit 109 in the conventional semiconductor device 103, therefore, the Schmidt circuit 9 (having a simpler structure than the difference voltage comparison circuit 109) simply comparing the voltage input in the positive phase input terminal with the constant voltage input in the negative phase input terminal can be employed. Consequently, the structure of the overall power converter 1 can be simplified as compared with the conventional power converter 101. Further, the Schmidt circuit 9 may only detect the potential of the terminal 60, whereby restriction of elements forming the circuit is reduced and desired electric characteristics can be readily attained.

Figure 7:
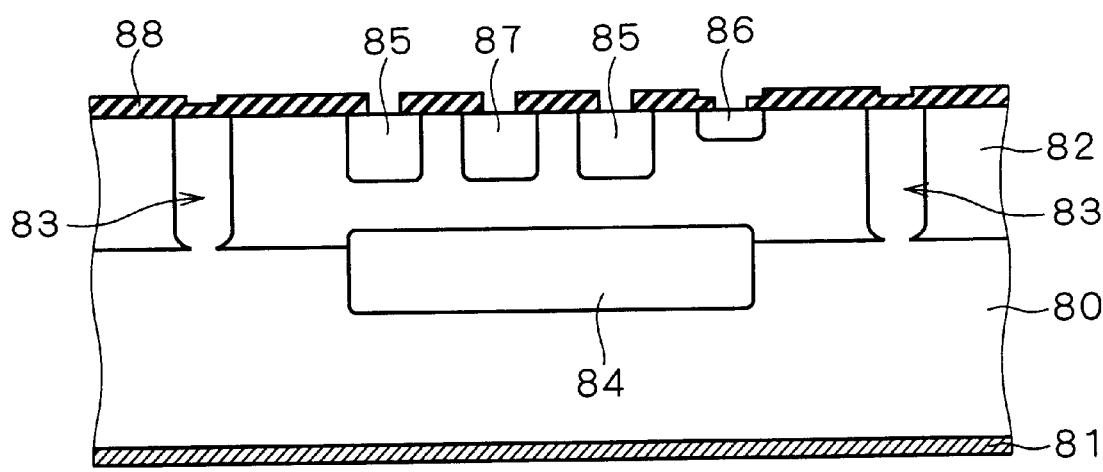
FIG. 7 is a sectional view showing a structure of a pnp transistor shown in FIG. 1.

In addition, the pnp transistor 17 or the p-channel MOSFET 37 is employed as the output circuit of the semiconductor device 3 in place of the npn transistor 117 in the conventional semiconductor device 103, to be capable of attaining the following effect:

FIG. 7 is a sectional view showing the structure of the pnp transistor 17 shown in FIG. 1. An n⁻-type epitaxial layer 82 is formed on the upper surface of a p-type silicon substrate 80. A p-type emitter region 87 is selectively formed in the upper surface of the epitaxial layer 82, and a p-type collector region 85 is formed to enclose the emitter region 87. An n-type base region 86 is selectively formed in the upper surface of the epitaxial layer 82, and a p-type diffusion layer 83 is formed to enclose the emitter region 87, the collector region 85 and the base region 86. An n⁺-type embedded diffusion layer 84 is formed in the bottom surface of the epitaxial layer 82 and in the upper surface of the silicon substrate 80 under the emitter region 87, the collector region 85 and the base region 86. A silicon oxide film 88 is selectively formed on the upper surface of the epitaxial layer 82, and a metal layer 81 is formed on the rear surface of the silicon substrate 80.

The pnp transistor 17 can be inhibited from a malfunction also when the potentials of the silicon substrate 80 and the epitaxial layer 82 transitionally exceed the potential of the collector region 85 while the pnp transistor 17 is in an OFF state. In other words, a p-n junction formed by the p-type collector region 85 and the n⁻-type epitaxial layer 82 is reverse-biased and hence the pnp transistor 17 is not turned on within a range not exceeding the reverse withstand voltage of the p-n junction.

Embodiment 2.

Figure 8:
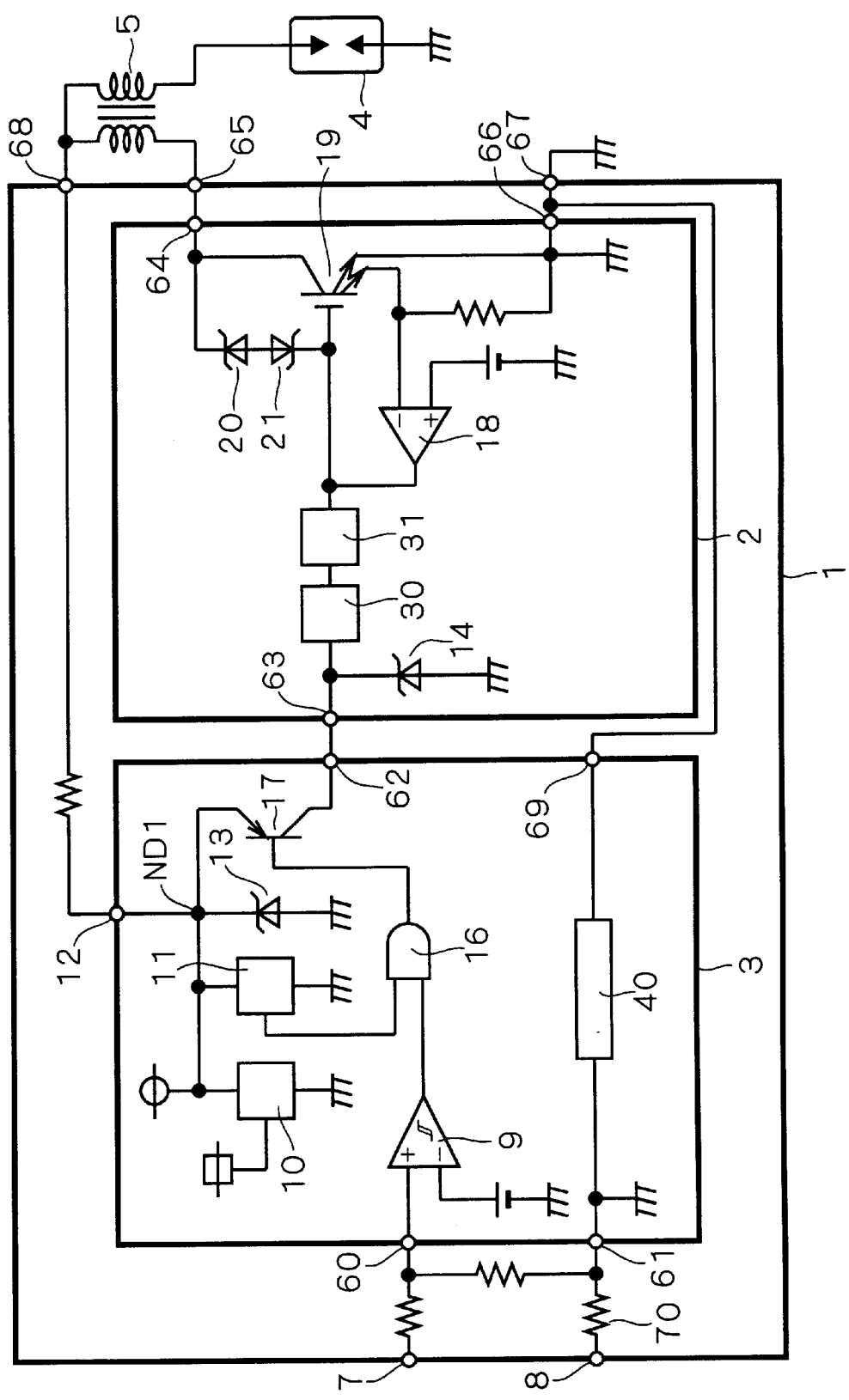
FIG. 8 is a circuit diagram showing a structure of a power converter according to an embodiment 2 of the present invention.

FIG. 8 is a circuit diagram showing the structure of a power converter according to an embodiment 2 of the present invention. As shown in FIG. 8, the power converter according to the embodiment 2 is based on the power converter 1 according to the embodiment 1 shown in FIG. 1, with additional formation of a voltage limiting circuit 40 in a semiconductor device 3. The voltage limiting circuit 40 has an end connected to a terminal 61 and another end connected to a terminal 66 of another semiconductor device 2 through a terminal 69 of the semiconductor device 3. The remaining structure of the power converter according to the embodiment 2 is similar to that of the power converter 1 according to the embodiment 1.

When potential difference exceeding a prescribed value is caused between the terminal 61 supplying a GND level of the semiconductor device 3 and the terminal 66 supplying a GND level of the semiconductor device 2, the voltage limiting circuit 40 renders the terminals 61 and 66 conductive for suppressing the aforementioned potential difference.

Figure 9:
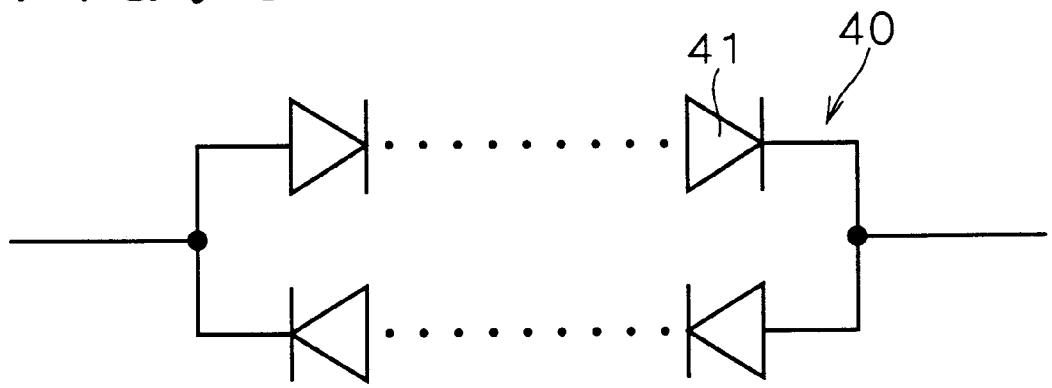
FIG. 9 is a circuit diagram showing a specific structure of a voltage limiting circuit.
Figure 10:
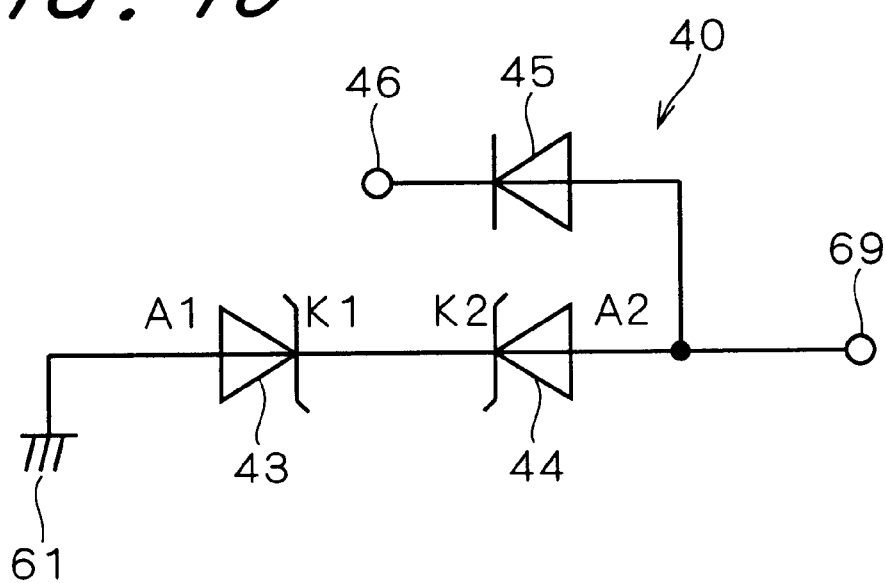
FIG. 10 is a circuit diagram showing another specific structure of the voltage limiting circuit.

FIGS. 9 and 10 are circuit diagrams showing exemplary structures of the voltage limiting circuit 40 respectively. The voltage limiting circuit 40 shown in FIG. 9 is formed by parallel-connecting a first diode train prepared by serially connecting a plurality of diodes 41 with each other and a second diode train prepared by serially connecting a plurality of diodes 41 in opposite directions to each other. Alternatively, each of the diode trains may be formed by a single diode 41. The voltage limiting circuit 40 shown in FIG. 10 is formed by serially connecting two Zener diodes 43 and 44 in opposite directions. Alternatively, each of the Zener diodes 43 and 44 may be formed by serially connecting a plurality of Zener diodes.

Figure 11:
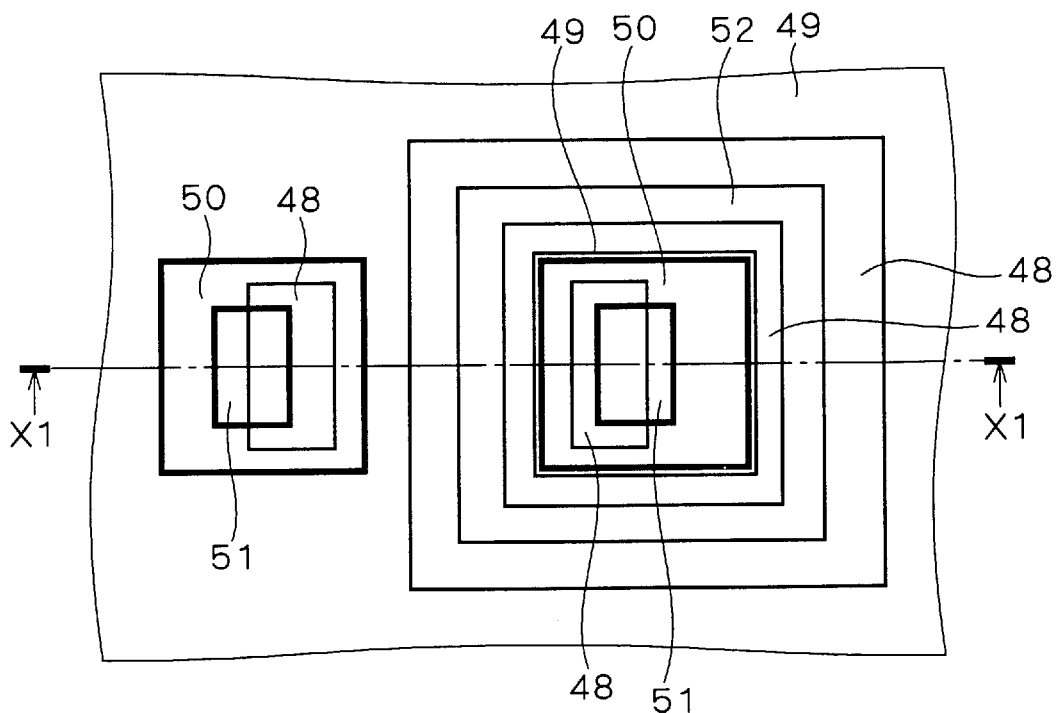
FIG. 11 is a top plan view showing a specific structure of the voltage limiting circuit shown in FIG. 10.
Figure 12:
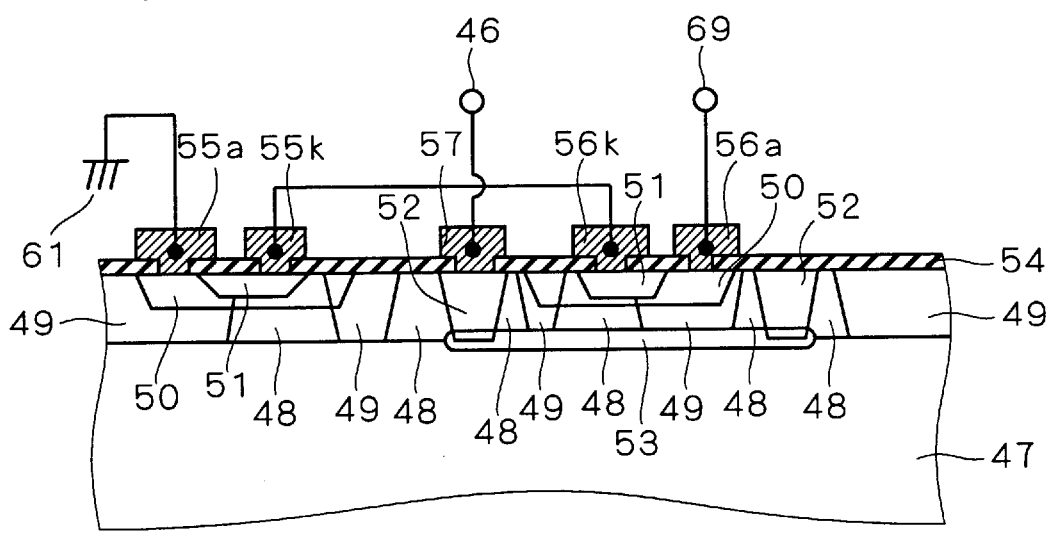
FIG. 12 is a sectional view taken along a line X1—X1 in FIG. 11.

FIG. 11 is a top plan view showing the specific structure of the voltage limiting circuit 40 shown in FIG. 10, and FIG. 12 is a sectional view taken along the line X1—X1 in FIG. 11. Referring to FIGS. 11 and 12, n-type epitaxial growth layer 48 is formed on a p-type silicon substrate 47. P-type isolation diffusion regions 49, p-type base diffusion regions 50 and n⁺-type emitter diffusion regions 51 are selectively formed in the epitaxial growth layer 48 by introducing impurities respectively. The isolation diffusion regions 49 reach the upper surface of the silicon substrate 47 from the upper surface of the epitaxial growth layer 48. The base diffusion regions 50 are formed in a depth not reaching the upper surface of the silicon substrate 47 from the upper surface of the epitaxial growth layer 48. The base regions 50 are formed to include upper portions of the epitaxial growth layer 48 not formed with the isolation diffusion regions 49 and partially overlap with the isolation diffusion regions 49. The emitter diffusion regions 51 are formed more shallowly than the base diffusion regions 50 from the upper surface of the epitaxial growth layer 48 to be surrounded by the base diffusion regions 50. Parts of the emitter diffusion regions 51 are present in regions where the base diffusion regions 50 and the isolation diffusion regions 49 overlap with each other.

Element isolation insulating films 54 are formed on the upper surface of the epitaxial growth layer 48. Metal wires 55a and 56a corresponding to anodes A1 and A2 are connected to the isolation diffusion regions 49 respectively, while metal wires 55k and 56k corresponding to cathodes K1 and K2 are connected to the emitter diffusion regions 51 respectively. The metal wire 55a is connected to the terminal 61, and the metal wire 56a is connected to the terminal 69. The metal wires 55k and 56k are connected with each other.

Assuming that Vf (V) and Vz (V) represent forward and reverse voltages of the Zener diodes 43 and 44 respectively, a current flows when the potential of the silicon substrate 47 is set to zero (V) and a voltage exceeding (Vz+Vf) (V) or a voltage less than −(Vz+Vf) (V) is applied to the terminal 69 while a high impedance state is attained when a voltage within a range of at least −(Vz+Vf) (V) and not more than (Vz+Vf) (V) is applied.

In the epitaxial growth layer 48, $n^+$-type embedded diffusion regions 52 and 53 are selectively formed for ensuring insulation between elements. The embedded diffusion regions 52 and 53 are formed to enclose the isolation diffusion region 49 of the Zener diode 44.

A metal wire 57 connected with an electrode 46 is formed on the upper surface of the epitaxial growth layer 48. The potential of the epitaxial growth layer 48 is fixed to a level exceeding Vz (V) (exceeding the reverse voltage of the Zener diode 44) due to a potential supplied from the electrode 46 through the metal wire 57.

Referring to FIG. 12, it is understood that there is a parasitic pnp transistor having an emitter defined by the silicon substrate 47, a base defined by the portion of the epitaxial growth layer 48 formed with the metal wire 57 and a collector defined by the isolation diffusion region 49 of the Zener diode 43. A current can be prevented from flowing from the silicon substrate 47 into the isolation diffusion region 49 of the Zener diode 43 following drive of the parasitic pnp transistor, by fixing the potential of the epitaxial growth layer 48 to a level exceeding Vz (V) from the electrode 46 through the metal wire 57.

In the power converter according to the embodiment 2, the voltage limiting circuit 40 is provided between the terminal 61 supplying the GND level of the semiconductor device 3 and the terminal 66 supplying the GND level of the semiconductor device 2 for suppressing the potential difference between the terminals 61 and 66 exceeding a prescribed value. Therefore, it is possible to suppress a malfunction resulting from abnormally large potential difference between the terminals 61 and 66, and a power converter having a smaller malfunction can be obtained.

The voltage limiting circuit 40 is formed in the semiconductor device 3, whereby the number of components can be reduced as compared with the case of forming the voltage limiting circuit 40 as a component independent of the semiconductor device 3.

While the invention has been shown and described in detail, the foregoing description is in all aspects illustrative and not restrictive. It is therefore understood that numerous modifications and variations can be devised without departing from the scope of the invention.

What is claimed is:

1. A power converter comprising:
a first semiconductor device including:
a first semiconductor substrate, and
a power conversion element formed on said first semiconductor substrate; and
a second semiconductor device formed on a second semiconductor substrate different from said first semiconductor substrate for generating a control signal for controlling drive of said power conversion element and inputting said control signal in said first semiconductor device on the basis of a signal input from an external control unit,
said first semiconductor device further includes a cutoff circuit formed on said first semiconductor substrate for detecting the temperature of said first semiconductor substrate on a portion formed with said power conversion element and stopping drive of said power conversion element when said temperature exceeds a prescribed level.

2. The power converter according to claim 1, wherein
said first semiconductor device further includes a waveform shaping circuit exhibiting a hysteretic characteristic, formed on said first semiconductor substrate, and
said waveform shaping circuit operates with drive power of a potential input in its own input terminal.

3. The power converter according to claim 1, wherein
said second semiconductor device has an output circuit for outputting said control signal, formed on said second semiconductor substrate, and
said output circuit is formed by a pnp transistor or a p-channel MOSFET formed in an n-type semiconductor layer.

4. The power converter according to claim 1, wherein
said first semiconductor device and said second semiconductor device individually include GND terminals supplied with GND levels.

5. The power converter according to claim 4, further comprising
a voltage limiting circuit limiting a potential difference between said GND level of said first semiconductor device and said GND level of said second semiconductor device within a prescribed value.

6. The power converter according to claim 5, wherein
said voltage limiting circuit is formed on said second semiconductor substrate.

7. The power converter according to claim 5, wherein
said voltage limiting circuit is formed by parallel-connecting a first diode train having at least one diode and a second diode train having at least one diode in opposite directions to each other.

8. The power converter according to claim 5, wherein
said voltage limiting circuit is formed by serially connecting at least two Zener diodes in opposite directions.

9. A power converter comprising:
a first semiconductor device having a power conversion element formed on a first semiconductor substrate; and
a second semiconductor device formed on a second semiconductor substrate different from said first semiconductor substrate for generating a control signal for controlling drive of said power conversion element and inputting said control signal in said first semiconductor device on the basis of a signal input from an external control unit, wherein
said first semiconductor device and said second semiconductor device individually include GND terminals supplied with GND levels.

10. The power converter according to claim 9, further comprising
a voltage limiting circuit limiting a potential difference between said GND level of said first semiconductor device and said GND level of said second semiconductor device within a prescribed value.

11. The power converter according to claim 11, wherein
said voltage limiting circuit is formed on said second semiconductor substrate.

12. The power converter according to claim 10, wherein
said voltage limiting circuit is formed by parallel-connecting a first diode train having at least one diode and a second diode train having at least one diode in opposite directions to each other.

13. The power converter according to claim 10, wherein said voltage limiting circuit is formed by serially connecting at least two Zener diodes in opposite directions.

14. A semiconductor device comprising:

a semiconductor substrate;

a power conversion element formed on said semiconductor substrate; and a cutoff circuit formed on said semiconductor substrate for detecting the temperature of said semiconductor substrate on a portion formed with said power conversion element and stopping drive of said power conversion element when said temperature exceeds a prescribed level.

15. The semiconductor device according to claim 14, further comprising a waveform shaping circuit exhibiting a hysteretic characteristic, formed on said semiconductor substrate, wherein said waveform shaping circuit operates with drive power of a potential input in its own input terminal.

* * * * *